United States Patent [19]

Ironmonger et al.

[11] 3,863,075

[45] Jan. 28, 1975

[54] LIGHT EMITTING DIODE ASSEMBLY

[75] Inventors: Edward Albert Ironmonger, Towcester; Roy Billam, Worksop, both of England

[73] Assignee: Plessey Handel und Investments A.G., Zug, Switzerland

[22] Filed: June 25, 1973

[21] Appl. No.: 373,593

[30] Foreign Application Priority Data

June 29, 1972 Great Britain .................... 30462/72

[52] U.S. Cl. ............................ 250/552, 317/235 N

[51] Int. Cl. ............................................ G02f 1/23

[58] Field of Search ............ 313/108 D; 317/235 N; 250/552; 339/126 RS

[56] References Cited

UNITED STATES PATENTS

| | | | |
|---|---|---|---|
| 3,086,074 | 4/1963 | Just | 339/126 RS |
| 3,512,027 | 5/1970 | Kupsky | 317/235 N |
| 3,609,475 | 9/1971 | Kaposhilin | 317/235 N |
| 3,667,117 | 6/1972 | Kunz | 313/108 D |
| 3,676,668 | 7/1972 | Collins | 313/108 D |
| 3,739,241 | 6/1973 | Thillays | 317/235 N |
| 3,760,237 | 9/1973 | Jaffe | 317/235 N |
| 3,764,862 | 10/1973 | Jankowski | 313/108 D |

*Primary Examiner*—Archie R. Borchelt
*Assistant Examiner*—D. C. Nelms
*Attorney, Agent, or Firm*—Scrivener Parker Scrivener & Clarke

[57] ABSTRACT

A light emitting diode assembly which includes a light reflector formed at one end of, and as an integral part of a first electrical supply lead; a light emitting diode mounted within the reflector, one side of the diode junction being connected in electrical contact with the reflector which in association with the first lead provides a high heat sinking facility; and a second electrical supply lead one end of which is connected in electrical contact with the other side of the diode junction. The diode, the reflector and the said one end of the second lead are encapsulated in a bead of a light transparent material.

A method producing the assembly using a U-shaped member from which the first and second leads are formed in described.

20 Claims, 6 Drawing Figures

PATENTED JAN 28 1975 3,863,075

LIGHT EMITTING DIODE ASSEMBLY

Figures 1, 2, 3, 4A, 4B, 5:
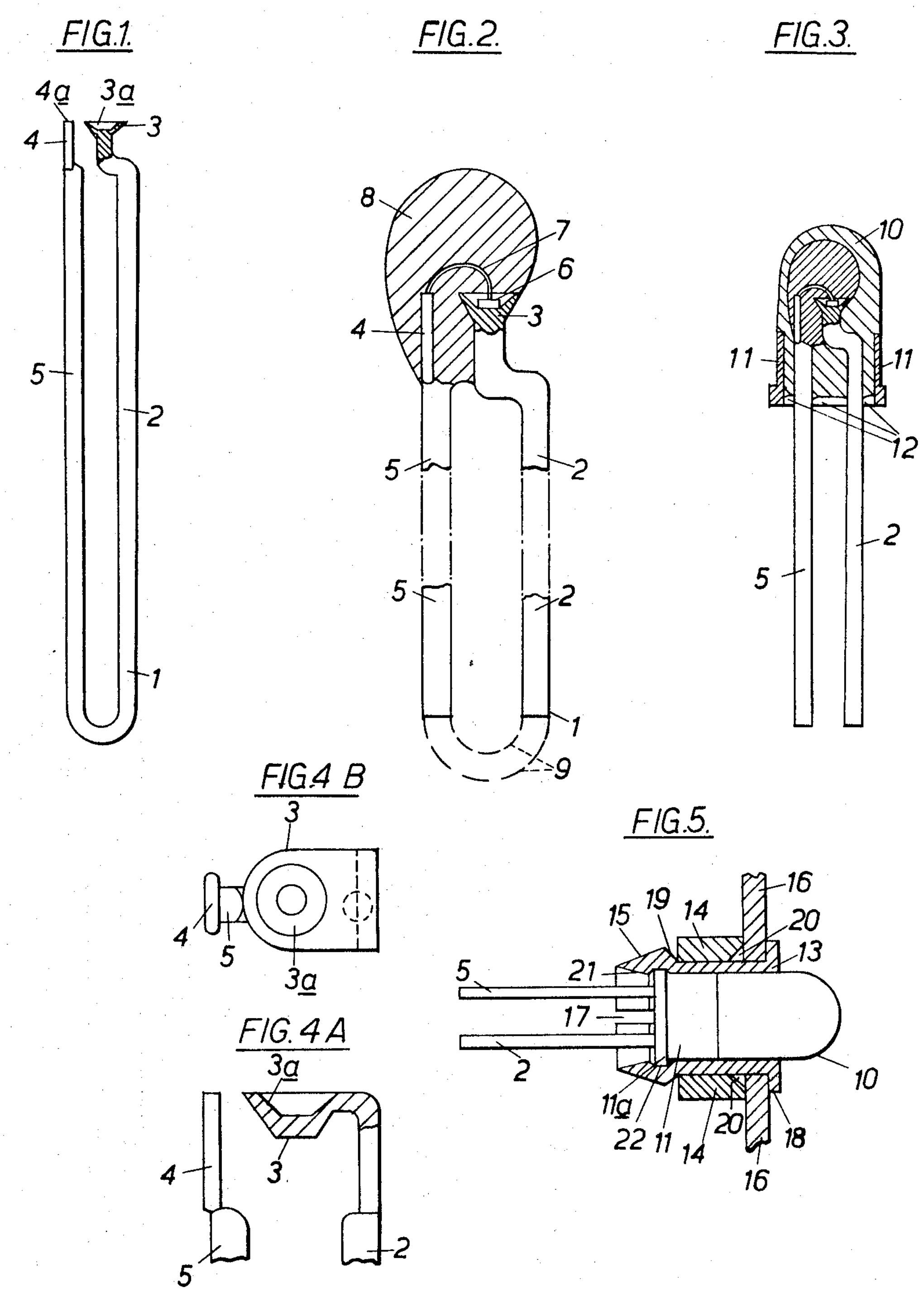

The invention relates to light emitting diode assemblies and to methods of producing the diode assemblies.

The invention provides a light emitting diode assembly which includes a light reflector formed at one end of, and as an integral part of, a first electrical supply lead; a light emitting diode mounted within the reflector, one side of the diode junction being connected in electrical contact with the reflector; and a second electrical supply lead, one end of which is connected in electrical contact with the other side of the diode junction, the diode, the reflector and the said one end of the second electrical supply lead being encapsulated in a bead of a light transparent material.

The invention also provides a method of producing a light emitting diode assembly which includes the steps of providing a U-shaped member of an electrically conductive material; forming the free end of one limb of the U into a dish-shaped section; forming a film of a light reflective contact material on at least the inner surface of the dish-shaped section; providing and mounting a light emitting diode within the dish-shaped section such that one side of the diode junction is connected in electrical contact with the said film; forming a film of a contact material on at least the free end of the other limb of the U; connecting the free end of the said other limb in electrical contact with the other side of the diode junction; encapsulating the diode, the dish-shaped section and the free end of the other limb of the U in a bead of a light transparent material; and severing each limb of the U at or near to the base of the U to provide two electrical supply leads for the diode.

The foregoing and other features according to the invention will be better understood from the following description with reference to the accompanying drawings, in which:

FIG. 1 diagrammatically illustrates in a partly sectioned front elevation part of a light emitting diode assembly according to the invention, FIG. 2 diagrammatically illustrates in an enlarged partly sectioned front elevation one arrangement for a light emitting diode assembly according to the invention, FIG. 3 diagrammatically illustrates in a partly sectioned front elevation another arrangement for a light emitting diode assembly according to the invention, FIGS. 4(A) and 4(B) diagrammatically illustrate respectively in an enlarged partly sectioned front elevation and an enlarged plan view part of a further arrangement for a light emitting diode assembly according to the invention, and FIG. 5 diagrammatically illustrates in a partly sectioned side elevation a panel mounting arrangement for the light emitting diode assembly of FIG. 3.

In a method according to the invention for producing the light emitting diode assembly diagrammatically illustrated in an enlarged partly sectioned front elevation in FIG. 2 of the drawings, an electrically conductive U-shaped member such as the member 1 diagrammatically illustrated in FIG. 1 of the drawings, is produced such that the free end of the limb 2 of the U is in the form of a dish-shaped section 3 and such that the free end 4 of the limb 5 of the U is reduced in section. The dish-shaped section 3 can be formed by an upsetting or forging operation. The inner surface 3*a* of the dish-shaped section 3 and the end 4*a* of the reduced section 4 are coated with a film of a light reflective contact material. Alternatively, the entire outer surface of the U-shaped member 1 can be coated with a film of the light reflective contact material. The dish-shaped section 3, therefore, forms a light reflector.

In practice, the U-shaped member 1 can be of nickel plated copper and the light reflective contact material film can be of gold.

In the next stage of the production method a light emitting diode 6 is provided and, as illustrated in FIG. 2, is mounted within the dish-shaped section 3 such that one side of the diode junction is connected in electrical contact with the contact material film, the electrical connection being effected by means of a solder interface, for example a gold/germanium alloy solder.

The end 4*a* of the limb 5 is then connected in electrical contact with the other side of the diode junction by means of a fine electrically conductive wire 7, the free ends of which are bonded to the respective contact areas.

The free ends of the U-shaped member 1 are then immersed into a light transparent material in liquid form, for example, an epoxy base resin, which hardenes, by the action of surface tension, over the extremities of the assembly to form, on solidification, a small bead 8 which encapsulates the diode assembly.

After the formation of the bead 8, the limbs 2 and 5 of the U-shaped member 1 are severed at or near to the base of the U thereby removing the base (illustrated by the dotted lines 9 in FIG. 2) and forming two electrical supply leads for the diode 6.

The structure of the light emitting diode assembly of FIG. 2 is such that a light reflector i.e. the inner coated surface 3*a* of the dish-shaped section 3, for enhancing the appearance of the light emitted by the diode 6 is formed as an integral part of the electrical supply lead 2 and, therefore, a high heat sinking facility is provided for the diode 6. Also, the structure of the assembly and the use of a U-shaped member in the production method gives rise to a low cost assembly and versatility of lead configuration.

In another arrangement for a light emitting diode assembly according to the invention which is diagrammatically illustrated in FIG. 3 of the drawings in a partly sectioned front elevation, the diode assembly of FIG. 2 is encapsulated in a transparent material, for example, an epoxy base resin, to provide an outer member 10 of a desired form. That part of the member 10 which extends forwardly of the reflector should, however, be of a shape, for example dome shaped, which is such that the light rays emitted by the diode 6 are radiated in a desired manner. The remainder of the member 10 which extends backwardly of the reflector can be of regular cross-section, for example, circular. A collar 11 of an opaque material may be provided and be secured in position during the formation of the member 10. The collar 11 will serve to enhance the appearance of the assembly and also to minimise the effects of any irregularity or meniscus 12 that may be present on the lower surface of the member 10. The outer shape of the member 10 will be as shown in FIG. 3 irrespective of whether the collar 11 is present or not.

In an alternative method according to the invention the dish-shaped section 3 could be formed in a manner as is diagrammatically illustrated in FIGS. 4(A) and 4(B) of the drawings respectively in an enlarged partly sectioned front elevation and an enlarged plan view. With this structure, the section 3 is formed by flattening the free end of the limb 2 of the U-shaped member, forming the dish-shaped section from the flattened portion and bending the free end of the limb 2 such that the inner surface 3*a* of the section 3 is uppermost in relation to the base of the U-shaped member. An intermediate annealing operation may be required in the formation of the dish-shaped section 3 of FIGS. 4(A) and 4(B).

A panel mounting arrangement for the light emitting diode assembly of FIG. 3 is diagrammatically illustrated in FIG. 5 of the drawings in a partly sectioned side elevation and includes a flanged bush 13 and a spacing washer 14. A chamfered end 15 of the bush 13 is passed through an aperture of a panel 16, two diametrically opposite and longitudinally extending slots (only one slot 17 being illustrated) in the wall of the bush allowing the wall of the bush to be inwardly collapsed and thereby the largest diameter section of the bush to be passed through the panel aperture. The flange 18 of the bush 13 abuts against the front of the panel 16 and is retained in its abutting relationship with the panel 16 by means of the spacing washer 14. The two slots 17 facilitate the fitting of the washer 14 to the bush 13 after the bush has been passed through the panel aperture. A chamfered annular shoulder 19 on the bush 13 retains the washer 14 in an abutting relationship with the back of the panel 16. The bore of the washer 14 is inwardly bevelled at 20, the angle of the bevel 20 being substantially the same as the angle of the chamber 19. Thus, when the washer 14 is fitted the other way round to the bush 13, the chamfer 19 and the bevel 20 cooperate with each other and allow the bush 13 to be retained in a panel of greater thickness than the panel 16. In order to accommodate an even thicker panel, the washer 14 can be dispensed with if the panel thickness is comparable with the length of that part of the bush 13 which is situated between the flange 18 and the chamfer 19. With this arrangement the bush 13 will be retained in the panel by means of the chamfer 19 cooperating with the back of the panel.

The bore of the bush 13 at the opposite end to the flanged end 18 is chamfered at 21 and is provided with an annular groove 22 which accommodates a flange 11*a* of the collar 11. Thus, after the bush 13 has been secured within the panel 16 the light emitting diode assembly of FIG. 3 is inserted into the bore of the bush 13 from the back of the panel 16, the chamfer 21 allowing the flange 11*a* of the diode assembly to be inserted into the bore of the bush and to be snapped into position in the annular groove 22. The two slots 17 allow the bore of the bush to be expanded immediately prior to the flange 11*a* of the collar 11 being snapped into position in the annual groove 22, the bore of the bush returning to its normal shape when the diode assembly is in position.

It should be noted that whilst the panel mounting arrangement utilises a bush 13 with only two longitudinally extending slots 17, the bush 13 can have three or four slots to effect the specified functions.

It is to be understood that the foregoing description of specific examples of this invention is made by way of example only and is not to be considered as a limitation in its scope.

What is claimed is:

1. A light emitting diode assembly which includes a light reflector formed at one end of, and as an integral part of, a first electrical supply lead; a light emitting diode mounted within the reflector, one side of the diode junction being connected in electrical contact with the reflector; and a second electrical supply lead, one end of which is connected in electrical contact with the other side of the diode junction, the diode, the reflector and the said one end of the second electrical supply lead being encapsulated in a bead of a light transparent material.

2. A light emitting diode assembly as claimed in claim 1 wherein the said one end of the second electrical supply lead is connected in electrical contact with the said other side of the diode junction by means of a electrically conductive wire.

3. A light emitting diode assembly as claimed in claim 1 wherein the light reflective surface of the reflector is formed by a film of a light reflective electrical contact material.

4. A light emitting diode assembly as claimed in claim 1 wherein the light transparent bead is encapsulated in a member of a light transparent material, that part of the member which extends upwardly of the reflector being of a shape which is such that the light rays emitted by the diode are radiated in a desired manner, the remainder of the member extending downwardly of the reflector being of regular cross-section.

5. A light emitting diode assembly as claimed in claim 4 wherein that part of the member which is of regular cross-section is provided with a collar of an opaque material.

6. A light emitting diode assembly as claimed in claim 4 which includes panel mounting means for the encapsulated diode.

7. A light emitting diode assembly as claimed in claim 6 wherein the panel mounting means include a bush having a flange at one end for limiting the insertion of the bush into an aperture in a panel, an annular shoulder with chamfered side edges at the other end, at least two longitudinally extending slots in the bush wall at the said other end for allowing the wall to be inwardly collapsed and a bore which is adapted to receive, and to retain, the said member in a position whereat the shaped end of the member projects beyond the flanged end of the bush.

8. A light emitting diode assembly as claimed in claim 7 wherein the length of that portion of the bush between the flange and the chamfered annular shoulder is substantially equal to the thickness of the said panel.

9. A light emitting diode assembly as claimed in claim 7 wherein the panel mounting means also include a spacing washer which has a bore that is adapted to receive that portion of the bush between the flange and the chamfered annular shoulder, and which is adapted to retain the flange of the bush in an abutting relationship with the said panel.

10. A light emitting diode assembly as claimed in claim 9 wherein the spacing washer is of a length less than the length of the said bush portion by an amount substantially equal to the thickness of the said panel.

11. A light emitting diode assembly as claimed in claim 9 wherein the bore of the spacing washer is inwardly bevelled at one end at substantially the same angle as that one of the chamfered side edges of the annular shoulder that is contiguous with the said bush portion, the length of the spacing washer from the other end thereof to the inner edge of the said bevel being less than the length of the said bush portion by an amount substantially equal to the thickness of the said panel.

12. A method of producing a light emitting diode assembly which includes the steps of providing a U-shaped member of an electrically conductive material; forming the free end of one limb of the U into a dish-shaped section; forming a film of a light reflective contact material on at least the inner surface of the dish-shaped section; providing and mounting a light emitting diode within the dish-shaped section such that one side of the diode junction is connected in electrical contact with the said film; forming a film of a contact material on at least the free end of the other limb of the U; connecting the free end of the said other limb in electrical contact with the other side of the diode junction; encapsulating the diode, the dish-shaped section and the free end of the other limb of the U in a bead of a light transparent material; and severing each limb of the U adjacent to the base of the U to provide two electrical supply leads for the diode.

13. A method as claimed in claim 12 wherein the free end of the said other limb is connected in electrical contact with the other side of the diode junction by means of a electrically conductive wire.

14. A method as claimed in claim 12 wherein the dish-shaped section is formed in the end of the said one limb by an upsetting operation.

15. A method as claimed in claim 12 wherein the formation of the dish-shaped section includes the steps of flattening the free end of the said one limb; forming the dish-shaped section from the flattened portion; and bending the free end of the said one limb such that the inner surface of the dish-shaped portion is uppermost in relation to the base of the U-shaped member.

16. A method as claimed in claim 12 wherein the said one side of the diode junction is connected in electrical contact with the said film by means of a solder interface.

17. A method as claimed in claim 16 wherein the solder interface is a gold/germanium alloy solder interface.

18. A method as claimed in claim 12 which includes the step of encapsulating the light transparent bead in a member of a light transparent material which has a shape forwardly of the reflector that is such that internal light reflections are minimised, the remainder of the member extending backwardly of the reflector being of regular cross-section.

19. A method as claimed in claim 18 which includes the steps of providing a collar of an opaque material; and securing the collar around that part of the member which is of regular cross-section during encapsulation of the light transparent bead.

20. A method as claimed in claim 12 wherein the U-shaped member is of nickel plated copper, and wherein the light reflective contact material is gold.

* * * * *